US008000423B2

(12) United States Patent
Auld et al.

(10) Patent No.: US 8,000,423 B2
(45) Date of Patent: Aug. 16, 2011

(54) ADAPTIVE SAMPLE RATE CONVERTER

(75) Inventors: David R. Auld, San Jose, CA (US); Warangkana Tepmongkol, Santa Clara, CA (US)

(73) Assignee: Zoran Corporation, Sunnyvale, CA (US)

( * ) Notice: Subject to any disclaimer, the term of this patent is extended or adjusted under 35 U.S.C. 154(b) by 1124 days.

(21) Appl. No.: 11/246,799

(22) Filed: Oct. 7, 2005

(65) Prior Publication Data

US 2007/0080834 A1    Apr. 12, 2007

(51) Int. Cl.
*H04B 1/10* (2006.01)

(52) U.S. Cl. .......................................... 375/350; 341/61

(58) Field of Classification Search .................. 375/350; 708/300

See application file for complete search history.

(56) References Cited

U.S. PATENT DOCUMENTS

| | | | |
|---|---|---|---|
| 5,892,468 A | 4/1999 | Wilson et al. | |
| 5,907,295 A | 5/1999 | Lin | 341/61 |
| 5,982,832 A | 11/1999 | Ko | 375/371 |
| 6,028,728 A | 2/2000 | Reed | 360/51 |
| 6,178,186 B1 * | 1/2001 | Baker et al. | 370/517 |
| 6,518,894 B2 | 2/2003 | Friedhof | 341/61 |
| 6,559,781 B2 | 5/2003 | Friedhof et al. | 341/61 |
| 6,584,145 B1 | 6/2003 | Camagna et al. | |
| 6,744,472 B1 | 6/2004 | MacInnis et al. | |
| 6,778,621 B1 | 8/2004 | Wilson et al. | 375/371 |
| 6,853,385 B1 | 2/2005 | MacInnis et al. | |
| 6,956,917 B2 * | 10/2005 | Lenosky | 375/350 |
| 7,061,409 B1 | 6/2006 | Jantti | |
| 7,079,157 B2 * | 7/2006 | Deering | 345/613 |
| 7,336,754 B2 | 2/2008 | Aoyama | |
| 2002/0126748 A1 * | 9/2002 | Rafie et al. | 375/229 |
| 2003/0025619 A1 | 2/2003 | Zhong | |
| 2003/0076950 A1 * | 4/2003 | Usman et al. | 379/406.08 |
| 2003/0100833 A1 * | 5/2003 | He et al. | 600/446 |
| 2004/0151267 A1 | 8/2004 | Raby et al. | 375/355 |
| 2004/0212734 A1 | 10/2004 | MacInnis et al. | |
| 2005/0265430 A1 * | 12/2005 | Ozluturk et al. | 375/145 |
| 2005/0280742 A1 * | 12/2005 | Jaffe | 348/726 |
| 2006/0158568 A1 | 7/2006 | Kaylani et al. | |
| 2006/0184596 A1 * | 8/2006 | Volleberg et al. | 708/300 |
| 2008/0037151 A1 * | 2/2008 | Fujimoto et al. | 360/18 |

OTHER PUBLICATIONS

Sample-Rate Converstion: Algorithms and VLSI Implementation, Fritz Markus Rothacher, Swiss federal institute of technology, 1995.*

Cuypers, G., et al., "Chebyshev Interpolation for DMT Modems," 2004 IEEE Int'l Conf. on Communications, vol. 5, Jun. 20-24, 2004, pp. 2736-2740.

Rothacher, F.M., "Sample-Rate Conversion: Algorithms and VLSI Implementation," doctorial dissertation submitted to Swiss Federal Institute of Technology, Zurich, Switzerland, 1995.

(Continued)

*Primary Examiner* — Dac Ha
*Assistant Examiner* — Tanmay K Shah
(74) *Attorney, Agent, or Firm* — Morgan, Lewis & Bockius LLP

(57) ABSTRACT

A sample rate converter includes a digital filter and control logic coupled to the digital filter. The digital filter is configured to receive an input data stream and to up convert the input data stream to produce an output data stream having a fixed data rate. The control logic configured to dynamically select a set of coefficients for taps in the digital filter during each clock cycle corresponding to the fixed data rate. The set of coefficients selected for each clock cycle is in accordance with a phase of the input data stream.

20 Claims, 7 Drawing Sheets

OTHER PUBLICATIONS

Gentile, K., "The Care and Feeding of Digital, Pulse-Shaping Filters," RF Mixed Signal, Apr. 2002, pp. 50, 52, 54, 56, 58, and 61.

Kohiyama, K., et al., "A Single-Chip Digital PLL System for TV Image Processing," IEEE International Solid-State Circuits Conference, 1991, ISSCC91/Session 15/Video Signal Processors/Paper FP 15.1, pp. 248-250.

Nuhertz Technology, "Raised Cosine Filter," downloaded Sep. 30, 2005, pp. 1-6. http://www.filter-solutions.com/raised.html.

International Search Report for PCT/US2006/030726 mailed Jan. 16, 2007.

Final Office Action for U.S. Appl. No. 11/247,891 dated Feb. 18, 2010.

* cited by examiner

ADAPTIVE SAMPLE RATE CONVERTER

TECHNICAL FIELD

The disclosed embodiments relate to sample rate converters and, in particular, to sample rate converters for re-sampling data streams corresponding to digital video, digital audio and/or metadata.

BACKGROUND

Receivers in digital communications systems are often operated synchronously, i.e., the receivers perform operations on a received data stream in accordance with one or more clock signals. In some receivers, the one or more clock signals are adjusted in accordance with the received data stream. For example, a tracking loop, including a phase locked loop or a delay locked loop, in a respective receiver may be used to determine or extract transition information (such as 0 to 1 or 1 to 0) corresponding to data in the received data stream. The transition information may be used in a feedback loop to adjust a frequency of a local oscillator (such as a voltage controlled oscillator) thereby locking one or more clock signals to the received data stream and enabling synchronous operation of the respective receiver.

In other receivers, the one or more clock signals may be adjusted in accordance with an externally sourced reference time signal. For broadcast audio and/or video, for example, a broadcast studio may provide the externally sourced reference time signal. The externally sourced reference time signal may be associated with a data rate of an encoded data stream, which corresponds to the audio or video information. The tracking loop may determine or extract transition information in the externally sourced reference time signal. The transition information may be used to adjust the frequency of a voltage controlled oscillator (the local oscillator) thereby locking the one or more clock signals to the externally sourced reference time signal. This allows the encoded data stream to be synchronously received by the respective receiver.

There are, however, several difficulties associated with these techniques in existing broadcast receivers. Adjustable local oscillators, such as voltage controlled oscillators, and crystal oscillators are often expensive components. Such components are also difficult to integrate with other circuits (i.e., they typically cannot be included on the same integrated circuit die as other circuits). Furthermore, adjustable local oscillators are typically used in a tracking loop, which often includes a digital-to-analog converter, which also does not integrate well with other circuits and does not scale well with different fabrication processes.

In addition to these challenges, a data rate of a received encoded data stream may vary considerably during different time intervals (as is the case with MPEG video formats) and/or with different encoding formats. As a consequence, many existing broadcast receivers include two or more adjustable local oscillators, further compounding the aforementioned difficulties.

Accordingly, there is a need for lower cost broadcast receivers that can be integrated with other electronics and accommodate encoded data streams that have variable data rates.

SUMMARY OF EMBODIMENTS

Accordingly the above deficiencies and other problems associated with receivers of input data streams corresponding to digital video, digital audio and/or metadata are reduced or eliminated by the disclosed sample rate converter that accepts input data streams having a variable data rate and outputs a data stream having a fixed data rate.

In some embodiments, a sample rate converter includes a digital filter and control logic coupled to the digital filter. The digital filter is configured to receive an input data stream and to up convert the input data stream to produce an output data stream having a fixed data rate. The control logic configured to dynamically select a set of coefficients for taps in the digital filter during each clock cycle corresponding to the fixed data rate. The set of coefficients selected for each clock cycle is in accordance with a phase of the input data stream.

In some embodiments, the digital filter has a number of taps equal to or greater than two, and has substantially unity gain up to a first predetermined frequency associated with an input data stream. During successive time intervals, the digital filter has a respective step response in a predetermined group of step responses. The sample rate converter is configured to up convert the input data stream corresponding to digital video, digital audio and/or metadata and to output an output data stream.

The number of taps may be an even number. The first predetermined frequency may be less than half the frequency associated with the data rate of the output data stream. A magnitude of transfer function corresponding to at least one respective step response of the digital filter may increase for frequencies greater than the first predetermined frequency and less than a second predetermined frequency.

In some embodiments, a data rate of the output data stream may be at least a factor two larger than a data rate of the input data stream. The data rate of the output data stream may have a fixed data rate. In other embodiments, the data rate of the output data stream may be less than, equal to, or greater than twice the data rate of the input data stream.

The set of coefficients used for the taps during each time interval may be selected from a predetermined group of sets of coefficients. For example, the predetermined group of sets of coefficients may include 512 respective sets of coefficients for the taps. Each respective set of coefficients corresponds to the respective phase of the input data stream. The group of step responses may include the step responses of Mitchell filters or the step responses of other filters that are based on cubic spline functions.

The phase may be determined in accordance with an externally sourced reference time signal and a local frequency reference. The externally sourced reference time signal may include a system clock reference.

In some embodiments, the sample rate converter is configured to provide a request to a memory (e.g., a first-in-first-out (FIFO) memory buffer) in order to receive the input data stream. The request may be in accordance with a control signal from a tracking loop. The tracking loop may be a feed-forward closed loop. The control signal may correspond to an accumulated phase between the externally sourced reference time signal and the local frequency reference. The accumulated phase may include a fractional component.

In some embodiments, the input data stream corresponds to a High Definition Multimedia Interface (HDMI) protocol. In some embodiments, the input data stream corresponds to a Digital Video Interface (DVI) protocol.

BRIEF DESCRIPTION OF THE DRAWINGS

Like reference numerals refer to corresponding parts throughout the drawings.

DESCRIPTION OF EMBODIMENTS

Figure 1:
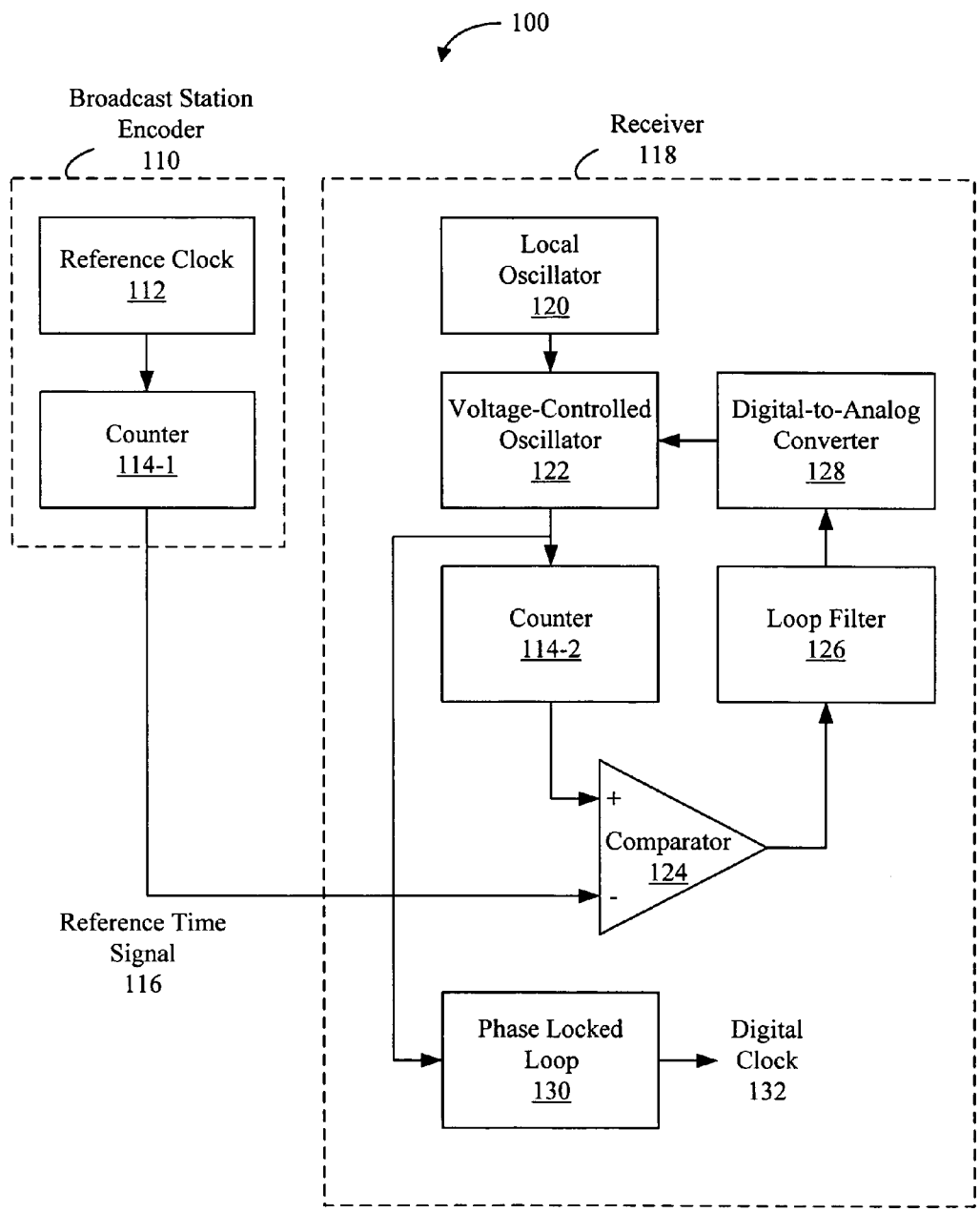
FIG. 1 is an illustration of one embodiment of an existing receiver.

Reference will now be made in detail to embodiments, examples of which are illustrated in the accompanying drawings. In the following detailed description, numerous specific details are set forth in order to provide a thorough understanding of the present invention. However, it will be apparent to one of ordinary skill in the art that the present invention may be practiced without these specific details. In other instances, well-known methods, procedures, components, and circuits have not been described in detail so as not to unnecessarily obscure aspects of the embodiments.

Embodiments of an adjustable receiver and a related sample rate converter are disclosed. The receiver receives an input data stream having a data rate that may vary from one time interval to the next (henceforth referred to as a variable data rate). The input data stream may correspond to digital video and/or audio data. The digital video and/or audio data may be compatible with standards such as Nation Television Systems Committee (NTSC), Phase Alternating Line (PAL), Sequential Color and Memory (SECAM), High Definition Television (HDTV), Advanced Television Standards Committee (ATSC), High Definition Multi-Media Interface (HDMI), Digital Video Interface (DVI) and/or one or more Motion Picture Experts Group (MPEG) standards. In some embodiments, the receiver may also be able to receive digital video data over interfaces that are compatible with a Universal Serial Bus (USB) standard (such as USB 2.0) and/or an IEEE 1394 standard (also known as Firewire).

The receiver is configured to output a data stream having a fixed data rate. A fixed output data rate is useful in driving displays, including cathode ray tubes (CRTs), liquid crystal displays, plasma displays, and/or projection displays. For example, a fixed data rate may simplify low pass filters that are used to filter signals that drive such displays and may allow processing of these signals using electronics (such as a reconstruction filter) that operate at a fixed clock frequency. In addition, the use of a fixed output data rate may allow the receiver to be implemented using a single local oscillator. In other embodiments, however, there may be more than one local oscillator. In some embodiments, the local oscillator may output signals having a substantially fixed fundamental frequency, i.e., an adjustable local oscillator such as a voltage controlled oscillator may not be needed. Elimination of one or more voltage controlled oscillators and related digital-to-analog converters may allow improved integration of circuits in the receiver and make the receiver easier to fabricate, since the electronics in the resulting receiver may be compatible with a variety of manufacturing processes. These features may reduce an overall cost of the receiver.

The receiver may convert an input data stream having a variable data rate into an output data stream having a fixed data rate using a sample rate converter. The receiver may compare an externally sourced reference time signal (provided, for example, by a broadcaster) with a local time reference generated in the receiver in a tracking loop. The local time reference may be generated using a counter that is incremented by the local oscillator. A control signal generated in the tracking loop may be used to adjust a sample rate ratio, conversion rate or interpolation ratio of the sample rate converter. The sample rate converter may also generate a request for data in the input data stream (for example, from a memory) in accordance with the control signal.

In an exemplary embodiment, the control signal corresponds to a phase of the externally sourced reference time signal relative to the local time reference. The sample rate converter may include a digital filter and control logic. A set of coefficients of taps in the digital filter may be selected from a predetermined group of sets of coefficients in accordance with the relative phase.

Attention is now directed to embodiments of the adjustable receiver and the sample rate converter. In order to understand these embodiments, some existing receivers are now briefly discussed. FIG. 1 is an illustration of one embodiment of an existing receiver 100. A reference clock 112 and counter 114-1 in a broadcast studio encoder 110 generate a reference time signal 116. The reference time signal 116 is received by receiver 118. A local oscillator 120, a voltage-controlled oscillator 122 and a counter 114-2 in the receiver 118 generate a local time reference. The local time reference and the reference time signal 116 are compared in comparator 124. An output from the comparator is coupled to a loop filter 126, which filters the output. A digital-to-analog converter 128 coupled to the loop filter 126 provides a feedback signal to adjust the voltage-controlled oscillator 122.

An output from the voltage-controlled oscillator 122 is also coupled a phase locked loop 130. The phase locked loop 130 provides a digital clock 132 that is locked with the broadcast station encoder 110. This allows the receiver 118 to synchronously detect an input data stream (not shown) provided by the broadcast station encoder 110.

As discussed previously, the existing receiver 100 includes at least one voltage-controlled oscillator 122 in a feedback loop that is used to adjust the local time reference.

Figure 2:
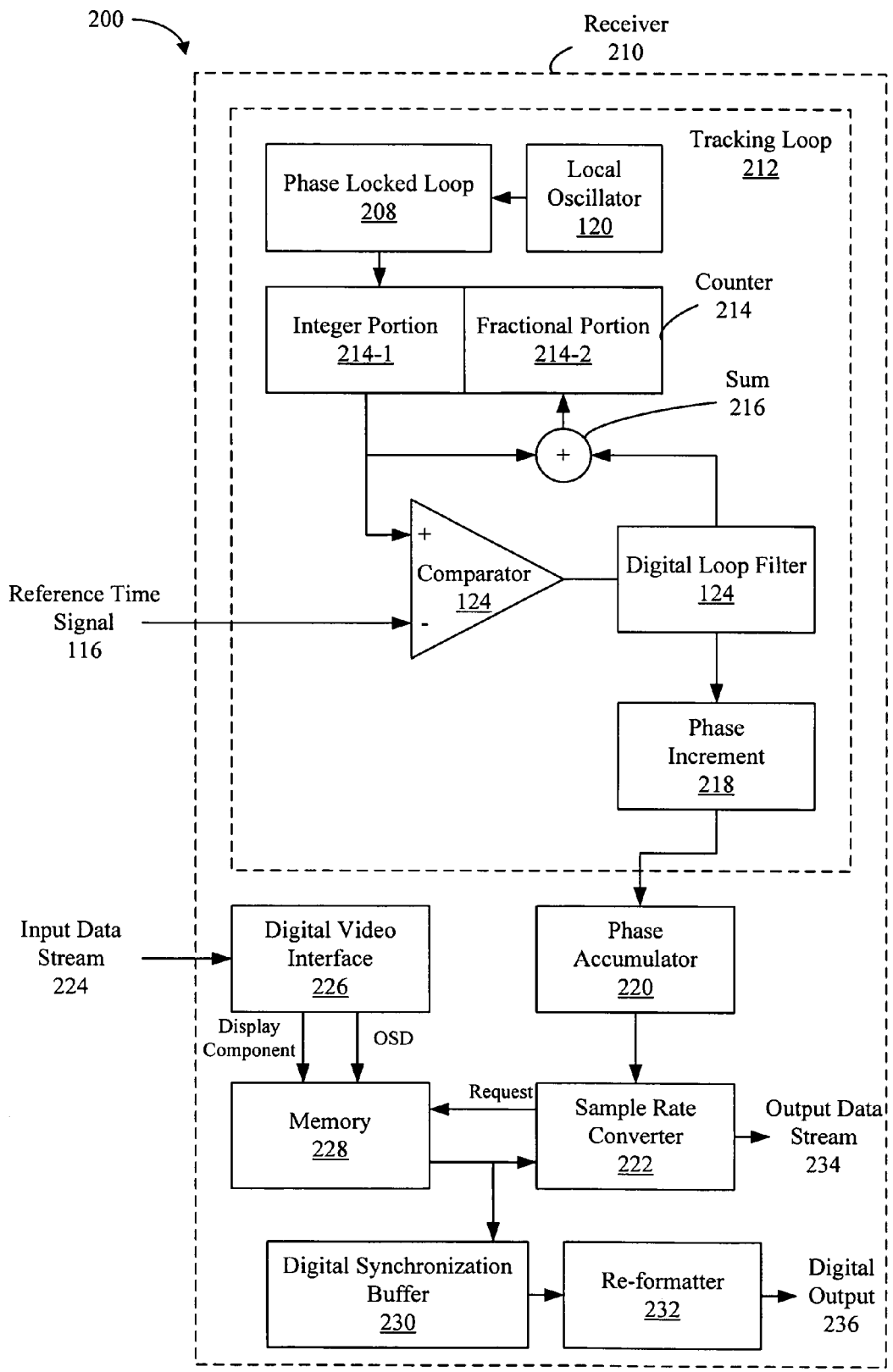
FIG. 2 is an illustration of one embodiment of an adaptive receiver.

FIG. 2 is an illustration of one embodiment 200 of an adaptive receiver 210. A reference time signal 116 is received. A comparator 124 in a tracking loop 212 compares the reference time signal with a local time reference. The local time reference is generated using a counter 214 that is incremented by an output from a phase locked loop 208. The phase locked loop converts an output from the local oscillator 120 to a frequency corresponding to a fixed data rate of an output data stream 234 of the receiver 210. The output from the local oscillator 120 has a fixed frequency. The counter 214 may include an integer portion 214-1 and a fractional portion 214-2. The frequency of the local oscillator 120 may by independent of the reference time signal, and may be selected to be any convenient value. In exemplary embodiments, the local oscillator 120 has a frequency of 24.576 MHz for systems which also integrate interfaces conforming to the IEEE 1394 standard.

A difference or error output by the comparator 124 is coupled to a digital loop filter 126. The digital loop filter 126 outputs error or difference of the reference time signal 116 to the local time reference to a summer 216. This output and the local time reference are summed in the summer 216 and used to update a value in the counter 214. In an exemplary embodiment, the frequency output by the phase locked loop 208 is 166 MHz and, on average, the value output by the loop filter 126 to the summer 216 is 27/166. This output, like the other electronics in the receiver 210 (with the exception of the local oscillator 120), is clocked at the frequency output by the phase locked loop, i.e., 166 MHz. On average, therefore, the counter 214 outputs a local frequency reference of 27 MHz that is compared in the comparator 124 with the reference time signal 116. It may be noted that the average value output by the loop filter 126 to the counter 214 is proportionally related to the average phase increment 218 used to adjust the operation of the sample rate converter 222 during each output clock cycle of the sample rate converter 222.

The reference time signal 116 is associated with and/or corresponds to data, such as digital video, digital audio and/or metadata, that is broadcast. As such, the reference time signal 116 corresponds to a current data rate of an input data stream 224 to the receiver 210, i.e., it tracks variations in the data rate of the input data stream 224. In an exemplary embodiment, the input data stream 224 to the receiver 210 is compatible with an MPEG standard, such as MPEG2. The reference time signal 116 may include a program clock reference (PCR). The counter 214 is an embodiment of the System Time Counter (STC). The PCR is a time stamp in an MPEG transport stream. A maximum interval between PCR time stamps is 100 ms (i.e., 10 Hz) and their frequency reference is 27 MHz. In this exemplary embodiment, the counter 214 is incremented by a fractional amount so that the integer portion of the counter 214-2 tracks the PCR. Thus, PCR time stamps in the reference time signal 116 are used to adjust the local time reference of the receiver 210 (via the counter 214), and the sample rate ratio of a sample rate converter 222, as discussed further below.

If there is a difference or an error between the reference time signal 116 and the local frequency reference (for example, a data rate of the input data stream 224 varies about an average value), the tracking loop 212 causes the counter 214 to count slower or faster based on the fractional portion 214-2. In this way, the local frequency reference provided by the counter 214 may be adjusted and/or track variations relative to the reference time signal 116.

Another output from the loop filter 126 is coupled to a phase increment 218. This output has a different scale than that coupled to the summer 216. In an exemplary embodiment, the input data stream 224 has a variable data rate between 13.5 and 74.25 MHz. Using 74.25 MHz as an example, every 166 MHz clock cycle the output to the phase increment 218 is proportional to $2\pi \times 74.25/166$ radians. The phase increment 218 converts this output to a fractional phase, i.e., one of a predetermined set of phases. This fractional phase corresponds to a relative phase of the local time reference and the reference time signal 116. In one embodiment, the sample rate converter 222 uses a set of 512 predetermined fractional phases, sometimes called phase steps. In this embodiment, when the input data stream has a data rate of 74.25 MHz, the average phase increment 218 of the input data stream (and thus of the sample rate converter) in this embodiment is equal to $512 \times 74.25/166$ phase steps, which is equal to approximately 229.012048 phase steps. In this example, the average phase increment 218 is equal to 1408 times the average output (i.e., 27/166) of the loop filter to the counter 214.

The receiver 210 receives the input data stream 224 (which in this example is video only), which is decoded and rasterized in digital video interface 226. Outputs from the digital video interface are coupled to memory 228. These outputs include a display component, sometimes called display data, and/or on-screen display (OSD) data. In an exemplary embodiment, the memory 228 is a frame buffer.

It may be noted that the digital video interface 226 may be a digital decoder, such as an MPEG decoder, and its output may be pixel data corresponding to the input data stream data stream 224. For instance, video signals are often encoded using MPEG encoding (e.g., MPEG2 encoding) and then broadcast. At the receiver 210, a corresponding MPEG decoder reconstructs the original digital video data stream, which is sometimes called pixel data, because it includes a set of values (e.g., Y, U, V values or R, G, B values) for each pixel of an image. In some embodiments, memory 228 includes two frame buffers, with one frame buffer being used to receive pixel data from the digital video interface 226 while pixel data in the other frame buffer is processed by the sample rate converter 222.

The phase increment output by the phase increment 218 is summed by a phase accumulator 220. In an exemplary embodiment, the phase accumulator 220 is a 32-bit fraction adder. For each 166 MHz clock cycle (corresponding to the fixed data rate of the output data stream 234), the phase accumulator 220 adds the phase increment value to a previous value in the phase accumulator 220. The current value produced by the phase accumulator 220 may be considered to be a phase of the input signal that is being up converted. When the phase accumulator 220 overflows, a control signal is output to the sample rate converter 222. Phase information in the control signal (which corresponds to a phase of the input signal) is used to adjust the sample rate ratio of the sample rate converter 222. (In particular, an integer portion of the accumulated phase may correspond to a respective pixel in the data received from the memory 228 (FIG. 2) and the fractional portion to a position between respective pixels.) In addition, the sample rate converter 222 outputs a request 238 to the memory 228 for data in accordance with the control signal. In this way, data is pulled into the sample rate converter 222.

The output data stream 234 from the sample rate converter 222 may be coupled to a digital-to-analog converter (DAC) (not shown) and displayed on one or more analog display devices, such as CRTs. The request 238 (from the sample rate converter 222) used to transfer data from the memory 228 to the sample rate converter 222 may also be used to transfer data from the memory 228 to the digital synchronization buffer 230. Thus, the request 238 from the sample rate converter 222 may also gate or synchronize the digital synchronization buffer 230.

An output from the digital synchronization buffer 230 may be coupled to a re-formatter 232. A digital output 236 from the re-formatter 232 may be used to drive digital displays, such as LCDs. Note that the digital output 236 is not re-sampled (as opposed to the output data stream 234). This is because analog displays, such as CRTs, are sensitive to jitter associated with a variable data rate. Digital displays, such as LCDs, latch the display data, thereby correcting for jitter.

The receiver 210 may be programmable to allow adjustment and/or configuration to one or more input data streams corresponding to different encoding standards. For example, values in registers in the counter 214 and/or the phase increment 218 may be programmable. Changing the register value in the phase increment 218 may adjust a conversion rate of a filtered error or difference signal (from the loop filter 126) into the phase increment. And changing the integer portion 214-1 and/or the fractional portion 214-2 of the counter 214 may adjust the local time reference. As discussed further below with reference to FIG. 3, sets of coefficients for a digital filter in the sample rate converter 222 may also be programmable.

While the embodiment 200 illustrates locking to the reference time signal 116 provided by a broadcaster, in other embodiments a different reference may be used. For example, if an external reference is not available, a reference from a VCR, CD-ROM, DVD, and/or another source may be used, such as HSYNC or VSYNC. While the embodiment 200 illustrates re-sampling of digital data corresponding to digital video, digital audio and/or metadata, variations on this basic technique may be used. For example, for audio data the sample rate converter 222 may up convert an audio clock as opposed to re-sampling the audio data.

While the embodiment 200 has been shown with a particular configuration of components, it should be understood that there may be more or fewer components. Functions of two or more components may be combined into a single component. And a relative position of two or more components may be changed. Functions in the receiver 210 may be implemented in hardware (such as one or more application specific integrated circuits) and/or software (such as firmware) executed by a microprocessor or microcontroller.

Figure 3:
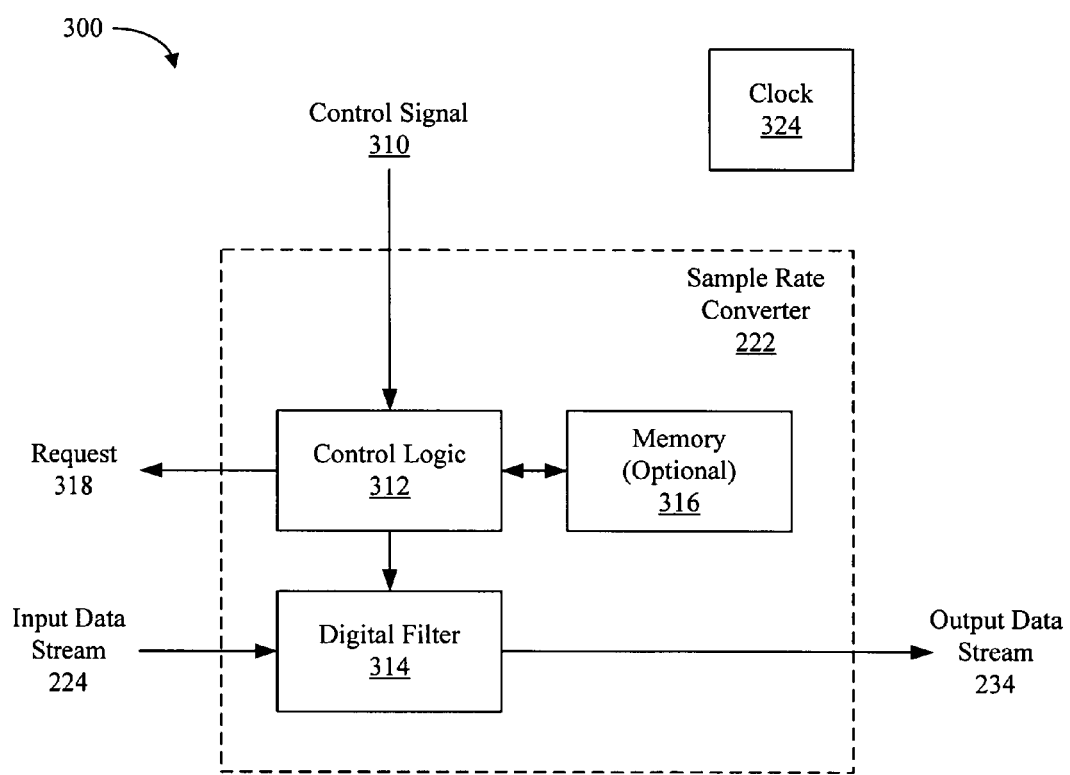
FIG. 3 is an illustration of one embodiment of a sample rate converter.

FIG. 3 is an illustration of one embodiment 300 of the sample rate converter 222. A control signal 310 is received from the phase accumulator 220 (FIG. 2) by control logic 312. The request 238 is provided by the control logic 312 to the memory 228 (FIG. 2) in accordance with the control signal 310. In addition, the control logic 312 may change and/or adjust a current set of coefficients of taps in a digital filter 314. The set of coefficients may be adjusted during each time interval corresponding to a cycle or period of the fixed data rate output data stream 234. As noted previously, in an exemplary embodiment the fixed data rate of the output data stream 234 may be 166 MHz. The time intervals may be provided by a clock 324 that is locked to the output data stream 234 or is generated using the local oscillator 120 (FIG. 2) (for example, by multiplying by N and dividing by M, where N and M are integers, or using the phase locked loop 208).

In some embodiments, a predetermined group including a plurality of sets of coefficients may be stored in a table in an optional memory 316. During each time interval, the control logic 312 may select an appropriate set of coefficients from the predetermined group in accordance with phase information in the control signal 310. In other embodiments, a gate array may be used to generate the filter coefficients in response to the phase information in control signal 310. The control logic 312 may select the appropriate set of coefficients during a respective time interval from those included in the gate array.

Therefore, in the embodiment 300 the control logic may dynamically adjust the set of coefficients used by the digital filter 314 during each time interval. The variable data rate of the input data stream 224 may be re-sampled to the fixed data rate of the output data stream 234 using a sequence of sets of coefficients in the digital filter 314.

As illustrated in the embodiment 300, the sample rate converter 222 effectively has an arbitrary sample rate ratio. The time resolution of the sample rate ratio, i.e., a number of phase steps, corresponds to a number of bits in the input data stream 224 and the desired jitter induced noise after the sample rate converter 222.

In an exemplary embodiment, the coefficients in each set of coefficients have 10 bits (i.e., they are 10-bit values); the digital filter 314 has an even number of taps (for example, 2 or 4 taps); and the plurality of sets of coefficients in the group includes 512 sets of coefficients corresponding to 512 different relative phases between the reference time signal 116 (FIG. 2) and the local frequency reference (i.e., different phases of the input data stream 224). In some embodiments, each of the sets of coefficients may correspond to a step response of the digital filter having substantially unity gain up to a predetermined frequency, which is illustrated further below with reference to FIG. 5. In some embodiments, unity gain may be understood to include variations within +/−1 dB of unity gain, while in other embodiments unity gain may be understood to include variations within +/−3 dB of unity gain. The pre-determined frequency is determined by a bandwidth corresponding to an information content in the input data stream 224. For example, for high definition television (having a data rate up to 74.25 MHz), the information content extends up to approximately 30 MHz. For NTSC, the information content extends up to approximately 6 MHz. In the exemplary embodiment where the fixed output data rate corresponds to 166 MHz, the pre-determined frequency relative to a Nyquist frequency of the output data stream 234 is 30/88 (34%) and 6/88 (6.8%) for high definition television and NTSC respectively. In should be understood, however, that higher data rates may be used for the output data rate. This would allow lower quality filters to be used for the digital filter 314, since the ratio of the pre-determined frequency to the Nyquist frequency for such filters would be reduced.

While the embodiment 300 has been shown with a particular configuration of components, it should be understood that there may be more or fewer components. Functions of two or more components may be combined into a single component. A relative position of two or more components may be changed. Functions in the sample rate converter 222 may be implemented in hardware (such as one or more application specific integrated circuits) and/or software (such as firmware) executed by a microprocessor or microcontroller. In addition, in some embodiments the control logic 312 may, at least in part, be implemented separately from the sample rate converter 222.

Figure 4:
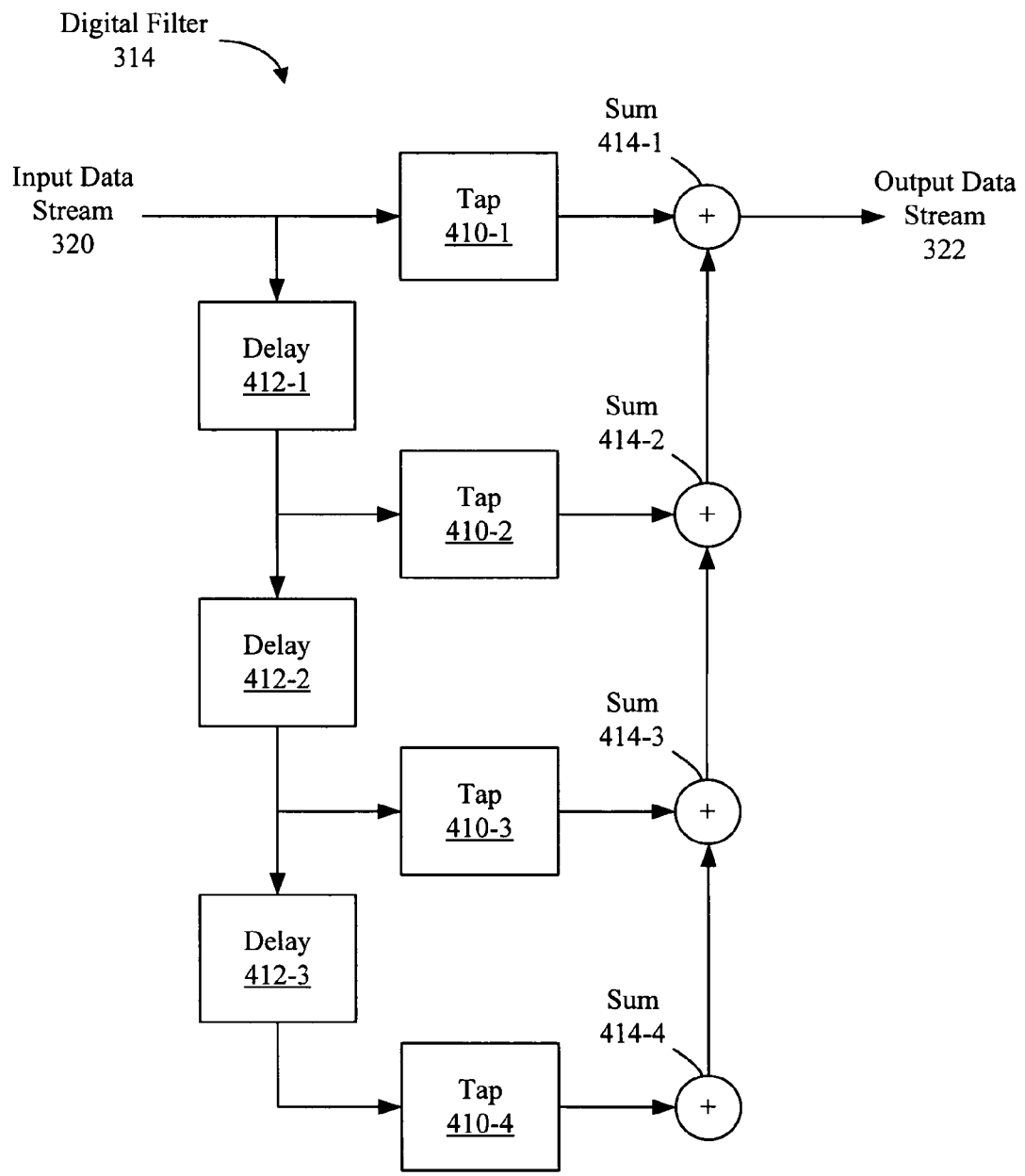
FIG. 4 is an illustration of one embodiment of a digital filter.

FIG. 4 is an illustration of one embodiment of the digital filter 314. The digital filter 314 includes four taps 410, three delay circuits 412 and four summation circuits 414. The delay circuits 412, which may be implemented using clocked registers, may be clocked using signals from the clock 324 (FIG. 3). While the digital filter 314 has been shown with four taps 410, in other embodiments there may be fewer or more taps. Additional taps will have additional delay circuits 412 and summation circuits 414. In some embodiments, the digital filter 314 may have a infinite impulse response filter as opposed to the finite impulse response filter illustrated.

Figure 5:
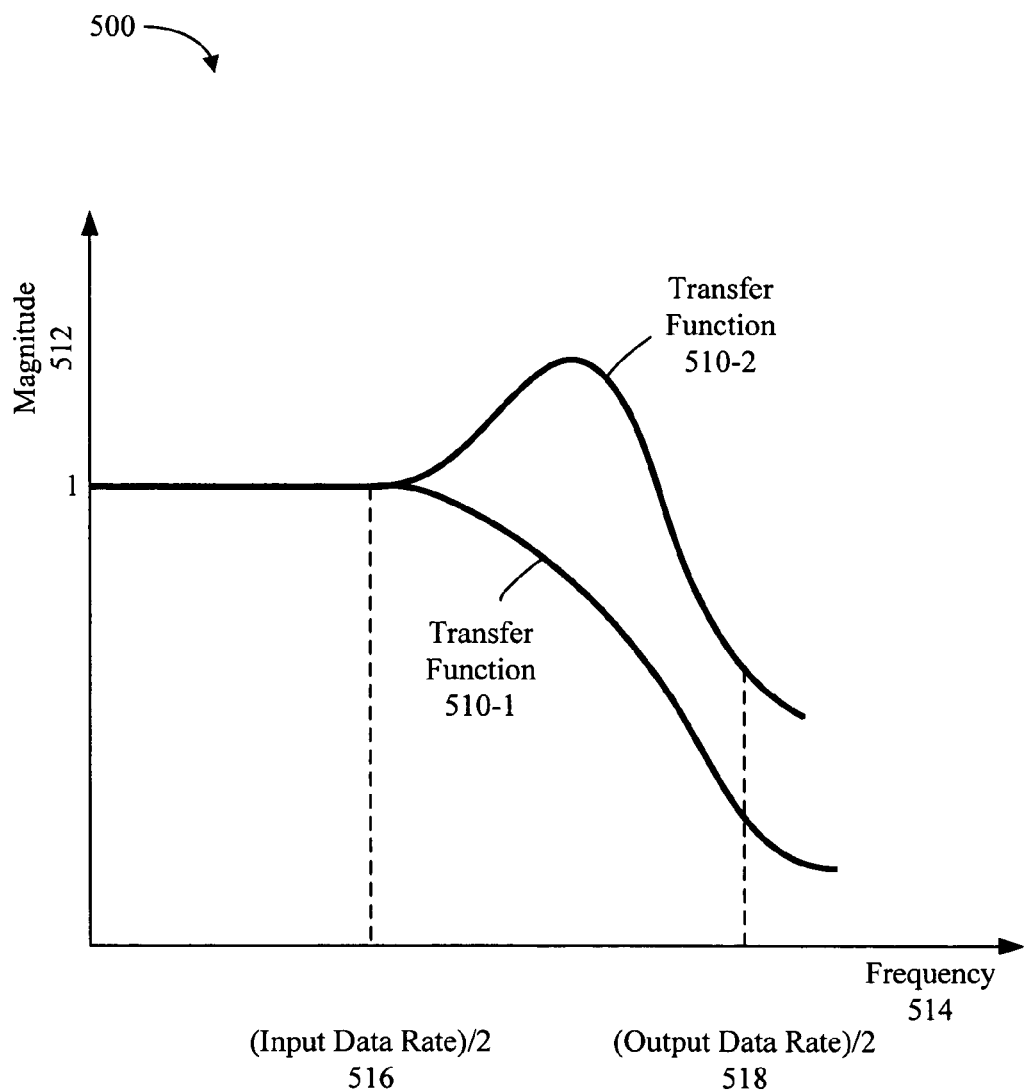
FIG. 5 is an illustration of an embodiment of two transfer functions corresponding to two step responses of a digital filter.

FIG. 5 is an illustration of two transfer functions 510 corresponding to two step responses of a digital filter, such as the digital filter 314 (FIGS. 3 and 4). Magnitude 512 as a function of frequency 514 are illustrated for the two transfer functions 510. A first transfer function 510-1 has substantially unity gain up to a first frequency and then decreases monotonically. A second transfer function 510-2 has substantially unity gain up to the first frequency and then increases before decreasing again in a vicinity of a second frequency equal to one half of the output data rate 518 (i.e., the Nyquist frequency) of the digital filter 314 (FIGS. 3 and 4).

In order to properly resample the input data stream 224 (FIGS. 2 and 3), the impulse responses (or equivalently the step responses or transfer functions) of the digital filter 314 (FIGS. 3 and 4) have approximately unity gain up to the first frequency. Note that the impulse responses of the digital filter 314 (FIG. 2 and 3) are not constrained for frequencies greater than the first frequency.

A wide variety of filters, with corresponding sets of coefficients, may be used to achieve these design constraints. Exemplary embodiments include Mitchell filters and filters corresponding to cubic spline functions. Other suitable filters include raised cosine filters and other multi-rate filters designed using computer aided design tools. For example, one suitable filter is a Mitchell filter having only 3% overshoot. The continuous time impulse response h(t) of this filter is $$h(t) = \frac{1}{6}\left(7|t|^3 - 12|t|^2 + \frac{16}{3}\right)$$

if |t| is less than 1, $$h(t) = \frac{1}{6}\left(-\frac{7}{3}|t|^3 + 12|t|^2 - 20|t| + \frac{32}{3}\right)$$

for |t| between 1 and 2, and $$h(t)=0$$

otherwise, where t is a phase of the input data stream 224 (FIGS. 2 and 3). For example, t may be one of 512 possible values.

Figure 6:
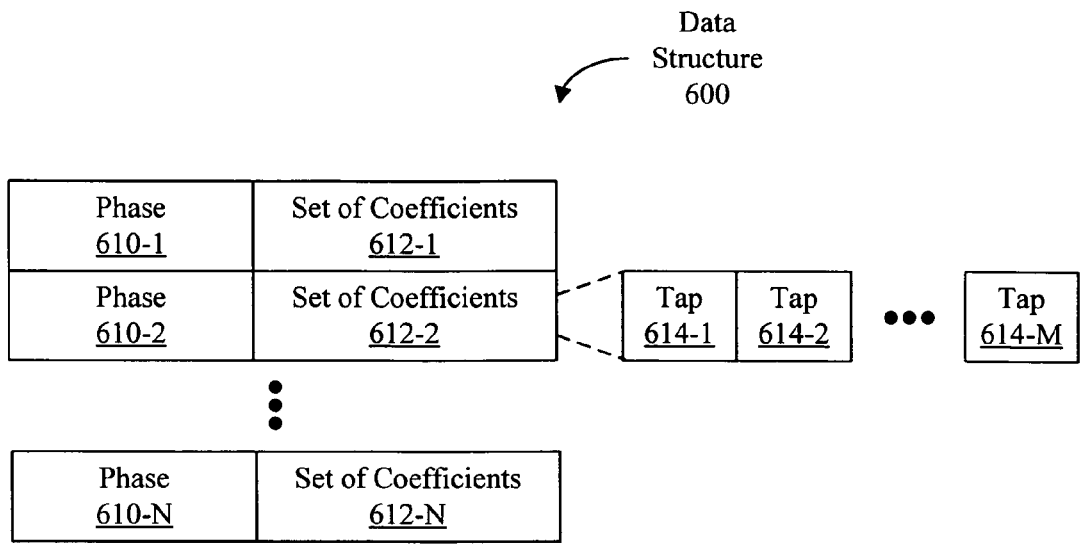
FIG. 6 is an illustration of one embodiment of a data structure.

FIG. 6 is an illustration of one embodiment of a data structure 600. The data structure 600 may be stored in the optional memory 316 (FIG. 3). The data structure 600 includes the predetermined group including the plurality of sets of coefficients. The data structure 600 includes phases 610 (or a range of phases) and corresponding sets of coefficients 612. Each set of coefficients, such as set of coefficients 612-2, includes tap values 614. In another embodiment, the data structure 600 stores the sets of coefficients 612, but not the phases 610. Instead, the phase associated with each set of coefficients 612 corresponds to the location of the set of coefficients 612 in the data structure 600. Stated another way, to locate the set of coefficients 612 for a particular phase, the phase is converted into a memory address, which is then used to access the set of coefficients 612 in the data structure 600.

Figure 7:
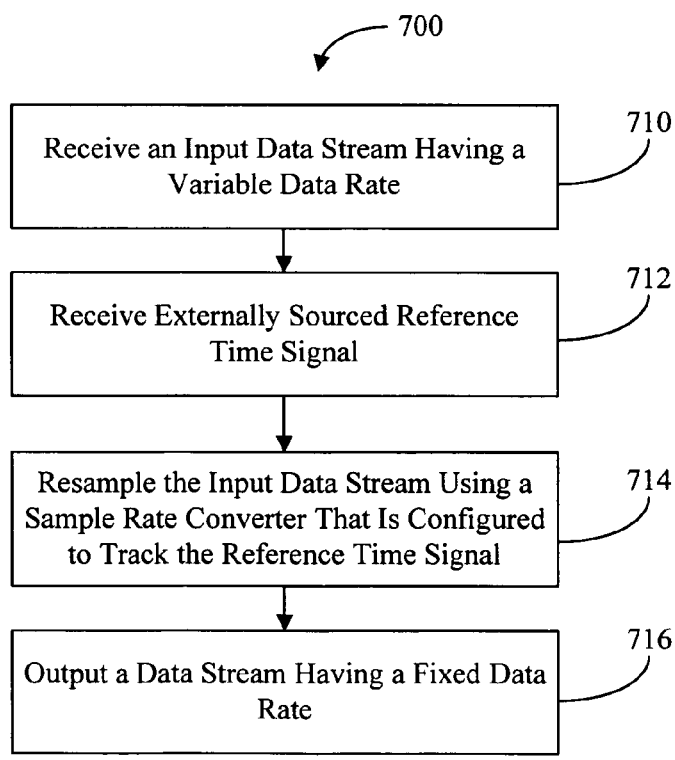
FIG. 7 is a flow diagram of one embodiment of operating an adaptive receiver.

FIG. 7 is a flow diagram of one embodiment 700 of operating an adaptive receiver. An input data stream having a variable data rate is received (710). An externally sourced reference time signal is received (712). The input data stream is re-sampled using a sample rate converter that is configured to track the reference time signal (714). A data stream having a fixed data rate is output (716). While the embodiment 700 includes a number of operations that appear to occur in a specific order, it should be apparent that these processes can include more or fewer operations, which can be executed serially or in parallel (e.g., using parallel processors or a multi-threading environment), an order of two or more operations may be changed and/or two or more operations may be combined into a single operation.

Devices and circuits described herein can be implemented using computer aided design tools available in the art, and embodied by computer readable files containing software descriptions of such circuits, at behavioral, register transfer, logic component, transistor, and layout geometry level descriptions stored on storage media or communicated by carrier waves. Data formats in which such descriptions can be implemented include, but are not limited to, formats supporting behavioral languages like C; formats supporting register transfer level RTL languages like Verilog and VHDL; and formats supporting geometry description languages like GDSII, GDSIII, GDSIV, CIF, MEBES, and other suitable formats and languages. Data transfers of such files on machine readable media including carrier waves can be done electronically over the diverse media on the Internet or through email, for example. Physical files can be implemented on machine readable media such as 4 mm magnetic tape, 8 mm magnetic tape, 3½ inch floppy media, magnetic hard disks, CDs, DVDs, and so on.

Figure 8:
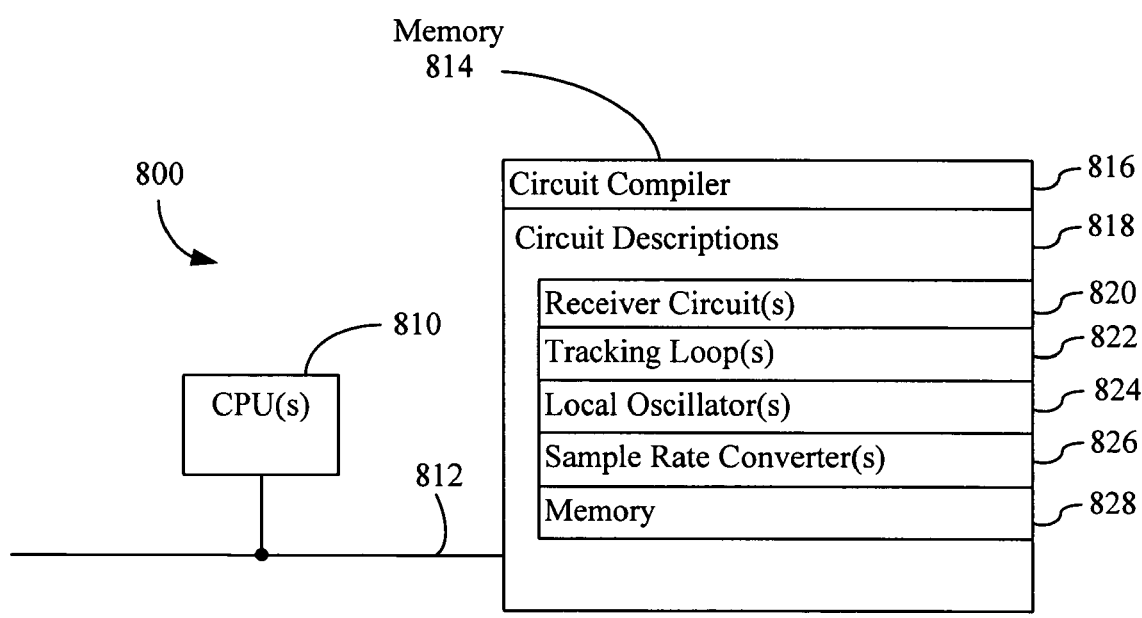
FIG. 8 is a block diagram illustrating an embodiment of a system.

FIG. 8 is a block diagram an embodiment of a system 800 for storing computer readable files containing software descriptions of the circuits. The system 800 may include at least one data processor or central processing unit (CPU) 810, memory 814, and one or more signal lines 812 for coupling these components to one another. The one or more signal lines 812 may constitute one or more communications buses.

Memory 814 may include high-speed random access memory and/or non-volatile memory, such as one or more magnetic disk storage devices. Memory 814 may store a circuit compiler 816 and circuit descriptions 818. The circuit descriptions 818 may include circuit descriptions for one or more receiver circuits 820, one or more tracking loops 822, one or more local oscillators 824, one or more sample rate converters 826, and memory 828. More generally, the circuit descriptions 818 may include circuit descriptions for one or more embodiments of the circuits described above. The circuit compiler 816 may be used to convert the circuit descriptions 818, or a subset thereof, into a circuit layout.

The foregoing descriptions of specific embodiments of the present invention are presented for purposes of illustration and description. They are not intended to be exhaustive or to limit the invention to the precise forms disclosed. Rather, it should be appreciated that many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:
1. A receiver, comprising:
an interface for receiving an externally sourced reference signal corresponding to a current data rate of a variable rate input data stream;
a fixed local frequency reference independent of the externally sourced reference signal;
a feed forward tracking loop comprising a counter that outputs a second local frequency reference in accordance with variations in the externally sourced reference signal, and a comparator that compares the externally sourced reference signal and the second local frequency reference and having an output coupled to an input of the counter by a digital loop filter, wherein the digital loop filter generates data used to determine an accumulated phase between the externally sourced reference time signal and the fixed local frequency reference; and
a sample rate converter, coupled to the feed forward tracking loop, the sample rate converter comprising:
a digital filter configured to receive the variable rate input data stream and to convert the variable rate input data stream to produce an output data stream having a fixed data rate determined in accordance with the fixed local frequency reference; and
control logic coupled to the digital filter and configured to dynamically select a set of coefficients for taps in the digital filter during each clock cycle corresponding to the fixed data rate, wherein the set of coeffi- cients selected for each clock cycle is selected in accordance with the accumulated phase.

2. A method, comprising:
receiving, at an interface, an externally sourced reference signal corresponding to a current data rate of a variable rate input data stream;
generating a fixed local frequency reference independent of the externally sourced reference signal;
at a feed forward tracking loop:
  outputting, at a counter, a second local frequency reference in accordance with variations in the externally sourced reference signal;
  comparing, at a comparator, the externally sourced reference signal and the second local frequency reference;
  coupling an output of the comparator to an input of the counter by a digital loop filter; and
  generating data used to determine an accumulated phase between the externally sourced reference time signal and the fixed local frequency reference; and
at a sample rate converter, coupled to the feed forward tracking loop:
  receiving the variable rate input data stream;
  resampling the variable rate input data stream using a digital filter to convert the variable rate data stream to produce an output data stream having a fixed data rate determined in accordance with the fixed local frequency reference; and
  dynamically selecting a set of coefficients for taps in the digital filter during each clock cycle corresponding to the fixed data rate, wherein the set of coefficients selected for each clock cycle is selected in accordance with the accumulated phase.

3. The receiver of claim 1, wherein the digital filter has a number of taps equal to at least two, has substantially unity gain up to a first predetermined frequency associated with a variable rate input data stream, and has, during successive clock cycles, a respective step response in a predetermined group of step responses.

4. The receiver of claim 1, wherein the digital filter has four taps.

5. The receiver of claim 1, wherein the digital filter has an even number of taps.

6. The receiver of claim 1, wherein a data rate of the output data stream is at least a factor 2 larger than a data rate of the variable rate input data stream.

7. The receiver of claim 1, wherein the set of coefficients used for the taps during each clock cycle are selected from a predetermined group of sets of coefficients.

8. The receiver of claim 7, wherein the predetermined group of sets of coefficients includes 512 respective sets of coefficients for the taps, each respective set of coefficients corresponding to a respective phase of the variable rate input data stream.

9. The receiver of claim 3, wherein the group of step responses includes step responses of Mitchell filters.

10. The receiver of claim 3, wherein the group of step responses correspond to cubic spline functions.

11. The receiver of claim 3, wherein the first predetermined frequency is less than 0.5 times a frequency associated with a data rate of the output data stream.

12. The receiver of claim 3, wherein a magnitude of a transfer function corresponding to at least one respective step response of the digital filter increases for frequencies greater than the first predetermined frequency and less than a second predetermined frequency.

13. The receiver of claim 1, wherein the externally sourced reference time signal includes a system clock reference.

14. The receiver of claim 1, wherein the sample rate converter is configured to provide a request to a memory in order to receive the variable rate input data stream.

15. The receiver of claim 1, wherein the variable rate input data stream corresponds to a High Definition Multimedia Interface (HDMI) protocol.

16. The receiver of claim 1, wherein the variable rate input data stream corresponds to digital video.

17. The receiver of claim 1, wherein the variable rate input data stream corresponds to digital audio.

18. The receiver of claim 1, wherein:
the data used to determine the accumulated phase is a phase increment signal that corresponds to a relative phase of the fixed local frequency reference and the externally sourced reference time signal corresponding to the current data rate of the variable rate input data stream; and
the receiver further comprises an accumulator to generate the accumulated phase between the externally sourced reference time signal and the fixed local frequency reference in accordance with the phase increment signal.

19. A receiver, comprising:
an interface for receiving an externally sourced reference signal corresponding to a current data rate of a variable rate input data stream;
a fixed local frequency reference independent of the externally sourced reference signal;
a feed forward tracking loop comprising a counter that outputs a second local frequency reference in accordance with variations in the externally sourced reference signal, and a comparator that compares the externally sourced reference signal and the second local frequency reference and having an output coupled to an input of the counter by a digital loop filter, wherein the digital loop filter generates data used to determine an accumulated phase between the externally sourced reference time signal and the fixed local frequency reference; and
a sample rate converter, coupled to the feed forward tracking loop, the sample rate converter comprising:
  a decoder to receive the variable rate input data stream and to decode the variable rate input data stream to produce a decoded data stream;
  a digital filter configured to receive the decoded data stream and to convert the decoded data stream to produce an output data stream having a fixed data rate determined in accordance with the fixed local frequency reference; and
  control logic coupled to the digital filter and configured to dynamically select a set of coefficients for taps in the digital filter during each clock cycle corresponding to the fixed data rate, wherein the set of coefficients selected for each clock cycle is selected in accordance with the accumulated phase.

20. A method, comprising:
receiving, at an interface, an externally sourced reference signal corresponding to a current data rate of a variable rate input data stream;
generating a fixed local frequency reference independent of the externally sourced reference signal;
at a feed forward tracking loop:
  outputting, at a counter, a second local frequency reference in accordance with variations in the externally sourced reference signal;
  comparing, at a comparator, the externally sourced reference signal and the second local frequency reference;

coupling an output of the comparator to an input of the counter by a digital loop filter; and generating data used to determine an accumulated phase between the externally sourced reference time signal and the fixed local frequency reference; and at a sample rate converter, coupled to the feed forward tracking loop:

receiving the variable rate input data stream;

decoding the variable rate input data stream to produce a decoded data stream;

converting the decoded data stream to produce an output data stream having a fixed data rate determined in accordance with the fixed local frequency reference; and dynamically selecting a set of coefficients for taps in the digital filter during each clock cycle corresponding to the fixed data rate, wherein the set of coefficients selected for each clock cycle is selected in accordance with the accumulated phase.

* * * * *